United States Patent
Lin et al.

(10) Patent No.: US 7,558,301 B2
(45) Date of Patent: Jul. 7, 2009

(54) MULTIWAVELENGTH SEMICONDUCTOR LASER ARRAY AND METHOD OF FABRICATING THE SAME

(75) Inventors: Kuo-Jui Lin, Hsinchu (TW); Tung-Wei Chi, Hsinchu (TW); Kun-Feng Lin, Hsinchu (TW); Chih-Ming Lai, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 120 days.

(21) Appl. No.: 11/803,583

(22) Filed: May 15, 2007

(65) Prior Publication Data

US 2008/0151950 A1    Jun. 26, 2008

(30) Foreign Application Priority Data

Dec. 20, 2006    (TW) ............................... 95148051 A

(51) Int. Cl.
*H01S 3/10*    (2006.01)
*H01S 5/00*    (2006.01)

(52) U.S. Cl. ..................... 372/23; 372/43.01
(58) Field of Classification Search ............... 372/23, 372/43.01

See application file for complete search history.

(56) References Cited

U.S. PATENT DOCUMENTS

| 6,600,169 B2 | 7/2003 | Stintz et al. |
| 6,643,310 B2* | 11/2003 | Nemoto ................... 372/50.1 |
| 6,816,525 B2 | 11/2004 | Stintz et al. |
| 7,403,552 B2* | 7/2008 | Botez et al. ............. 372/43.01 |
| 7,408,966 B2* | 8/2008 | Botez ..................... 372/45.01 |
| 2005/0281308 A1* | 12/2005 | Kim ........................ 372/70 |
| 2006/0083278 A1* | 4/2006 | Tan et al. ................ 372/43.01 |
| 2007/0201522 A1* | 8/2007 | Huffaker et al. ............ 372/39 |

FOREIGN PATENT DOCUMENTS

JP    2000/340883    12/2000

\* cited by examiner

*Primary Examiner*—Minsun Harvey
*Assistant Examiner*—Phillip Nguyen
(74) *Attorney, Agent, or Firm*—Morris, Manning & Martin LLP; Tim Tingkang Xia

(57) ABSTRACT

A multiwavelength semiconductor laser array and a method of fabricating the same are provided. Laser resonators having stacked quantum dot active regions of different emission wavelengths are utilized together with a fabricating process to change the length of each laser resonator or that of an upper electrode layer to generate different laser oscillation conditions, such that each of the laser resonators generates a single-wavelength band laser in a specific quantum dot active region, thereby achieving a multiwavelength semiconductor laser array capable of generating multiple laser wavelengths.

13 Claims, 8 Drawing Sheets

MULTIWAVELENGTH SEMICONDUCTOR LASER ARRAY AND METHOD OF FABRICATING THE SAME

CROSS-REFERENCE TO RELATED APPLICATIONS

This non-provisional application claims priority under 35 U.S.C. § 119(a) on Patent Application No(s). 095148051 filed in Taiwan, R.O.C. on Dec. 20, 2006, the entire contents of which are hereby incorporated by reference.

BACKGROUND OF THE INVENTION

1. Field of Invention

The present invention relates to a semiconductor laser and a method of fabricating the same. More particularly, the present invention relates to a multiwavelength semiconductor laser array formed by a plurality of laser resonators and a method of fabricating the same.

2. Related Art

Recently, many research scholars have found that, compared with applications of semiconductor lasers such as bulk material without any quantum structure, quantum well, and quantum wire, the semiconductor laser having quantum dot as the active layer has an excellent laser property, and the quantum dot semiconductor laser is expected to have great potential in the application of the optoelectronic industry in the $21^{st}$ century.

Conventionally, a quantum dot is mainly fabricated by means of molecular beam epitaxy (MBE) or metalorganic chemical vapor deposition (MOCVD) through a self-assembly method, such that the quantum dot is self-assembled on a surface of a specific substrate. Currently, the self-assembled quantum dot is applied to semiconductor amplifiers, ultrahigh brightness light emitting diodes, tunable wavelength semiconductor lasers, and multiwavelength semiconductor lasers, and so on.

In the application of the conventional multiwavelength semiconductor laser, the distributed feedback (DFB) laser and the distributed Bragg reflector (DBR) laser are mainly used as major semiconductor laser devices, and grating regions are disposed in/out of the devices and adjacent to the active layer, and thus, different emission wavelengths are selected based on different grating periods.

The multiwavelength semiconductor laser is usually generated in two ways. One way is to utilize a single semiconductor laser device to generate different laser wavelengths, for example, as disclosed in Japanese Publication Patent No. 2000340883, a super structure grating is employed to control the selective optical modal gain of the wavelength. The other way is to employ a laser array formed by multiple semiconductor laser devices, and each device of the array generates a single laser with a unique wavelength. For example, U.S. Pat. No. 6,600,169 and No.6,816,525 disclose an epitaxial growth mode relevant to quantum dots and quantum wires, and meanwhile, provide applications of the tunable wavelength laser and multiwavelength laser array directed to the gain spectrum of continuous bandwidths of the quantum dot, in which the quantum dot DFB laser and quantum dot DBR laser are used as major laser devices, and wavelength-dependent mirror loss is caused by different grating periods, such that laser arrays formed by different laser resonator units have threshold modal gain at different levels, thus generating lasers of multiple wavelengths.

However, the fabrication process of the above multiwavelength semiconductor laser is very complicated, and the subsequent epitaxial regrowth has a rather high cost.

SUMMARY OF THE INVENTION

In view of the above problems, the present invention provides a multiwavelength semiconductor laser array and a method of fabricating the same, in which a laser array formed by a plurality of laser resonators is adopted with a simple fabrication process to change the lengths of resonant cavities or electrode layers on top of the laser resonators, such that each of the laser resonators generates a laser in a different wave band region.

The multiwavelength semiconductor laser array of the present invention can generate laser beams of different wave bands under an appropriate bias condition. Each of the laser resonators has a corresponding resonant cavity length for generating a single-wavelength band laser, and includes an active region capable of multiple wavelength emission. The active region is formed by alternately stacking a plurality of quantum dot layers and a plurality of quantum dot capping layers. At least two quantum dot layers or at least two quantum dot capping layers have different thicknesses or material compositions, and the laser resonators have at least two different cavity lengths. Furthermore, particularly, the active region has a plurality of regions capable of generating different light emission wave bands, in which the emission wavelengths of the wave band regions gradually decrease as being far away from the substrate. Each of the wave band regions further includes a plurality of periodic structure units formed by sequentially depositing a spacer layer, a quantum dot layer, and a quantum dot capping layer.

The present invention further provides a multiwavelength semiconductor laser array, applicable for generating laser beams of different wave bands under an appropriate bias condition. Each of the laser resonators has a corresponding length of electrode located on top of the laser resonators, and includes an active region capable of multiple wavelength emission. The active region is formed by alternately stacking a plurality of quantum dot layers and a plurality of quantum dot capping layers. At least two quantum dot layers or at least two quantum dot capping layers have different thicknesses or material compositions, and the laser resonators have at least two electrode layers with different lengths. Furthermore, particularly, the active region is formed by stacking a plurality of wave band regions capable of generating different emission wavelengths, in which the emission wavelengths of the wave band regions gradually decrease as being far away from the substrate. Each of the wave band regions further includes a plurality of periodic structure units formed by sequentially depositing a spacer layer, a quantum dot layer, and a quantum dot capping layer.

Meanwhile, the present invention provides a method of fabricating a multiwavelength semiconductor laser array, in which the multiwavelength semiconductor laser array includes a plurality of laser resonators, each of the laser resonators generates a single-wavelength band laser through oscillation under an appropriate bias condition, and each of the laser resonators has a plurality of corresponding resonant cavities and waveguide structures. The method of fabricating the multiwavelength semiconductor laser array includes: providing a substrate with a first cladding layer, an active region, and a second cladding layer sequentially disposed thereon, in which the active region is formed by repeatedly depositing a quantum dot layer, a quantum dot capping layer, and a spacer layer in sequence, and at least two quantum dot layers or at least two quantum dot capping layers in the active region are formed of different thicknesses or made by different material compositions; next, defining each of the waveguide structures by means of lithography and etching; and then, forming electrode of different lengths on each of the waveguide structures. For each of the laser resonators, different cavity lengths are defined by means of lithography and etching. Thus, a multiwavelength semiconductor laser array of the present invention is fabricated through the simple process as that mentioned above.

According to the multiwavelength semiconductor laser array and the method of fabricating the same provided by the present invention, a simplified process condition can be employed, and through changing the lengths of the resonant cavities or electrode layers on top of the laser resonators, the threshold modal gain required for generating laser oscillation varies, and thus, each of the laser resonators generates a single-wavelength band laser from a quantum dot active region capable of multiple wavelength emission due to different carrier densities, thereby achieving the application of a multiwavelength semiconductor laser. As such, the present invention can not only avoid complexity of relevant processes in the prior art, but also get rid of the fabrication cost on the epitaxial re-growth.

The detailed features and practice of the present invention will be described in detail in the following embodiments. Those skilled in the arts can easily understand the content of the present invention and make implementations accordingly. Furthermore, the relevant objectives and advantages of the present invention are apparent to those skilled in the arts with reference to the content disclosed in the specification, claims, and drawings.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the arts from this detailed description.

BRIEF DESCRIPTION OF THE DRAWINGS

The present invention will become more fully understood from the detailed description given herein below for illustration only, which thus is not limitative of the present invention, and wherein.

DETAILED DESCRIPTION OF THE INVENTION

The objectives, structures, features, and functions of the present invention will be illustrated in detail below accompanied with the embodiments. The above description of the content of the present invention and the following illustration of the embodiments are intended to demonstrate and explain the principles of the present invention and to provide further explanations of the claims of the present invention.

(Structure of Multiwavelength Semiconductor Laser Array)

Figure 1:
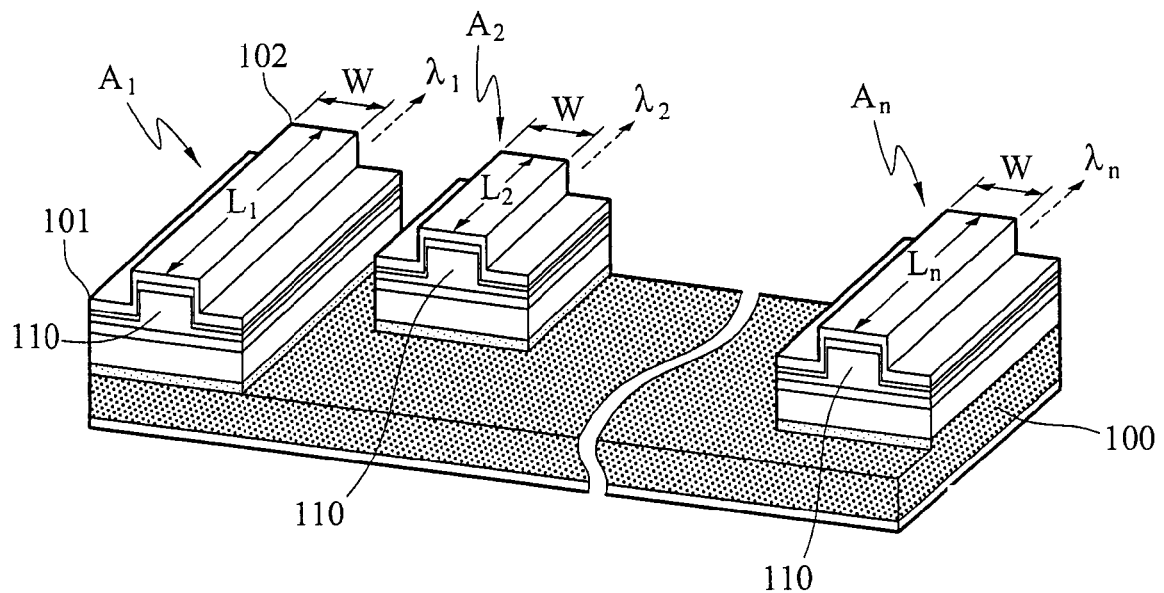
FIG. 1 is a structural stereogram of a multiwavelength semiconductor laser array according to a first embodiment of the present invention.

FIG. 1 is a structural stereogram of a multiwavelength semiconductor laser array according to a first embodiment of the present invention. As shown in FIG. 1, the. multiwavelength semiconductor laser array of the present invention includes a substrate 100 and N laser resonators $A_1$ to $A_n$. The N laser resonators $A_1$ to $A_n$ are formed on the substrate 100, which are parallel to each other and each has a corresponding ridge waveguide structure 110. Each ridge waveguide structure 110 has a width of W. Moreover, the laser resonators $A_1$ to $A_n$ respectively have a corresponding resonant cavity for generating a laser through oscillation, and the cavity lengths are respectively $L_1$ to $L_n$, which are different from each other. Once an appropriate bias current is applied to each of the laser resonators $A_1$ to $A_n$, the laser array formed by the laser resonators $A_1$ to $A_n$ on the substrate 100 generates lasers of different emission wavelengths $\lambda_1$ to $\lambda_n$. The front end surface 101 of each of the laser resonators $A_1$ to $A_n$ forms a reflection, mirror through crystalline natural cleavage or dry etching, and the rear end surface 102 forms a reflection mirror through dry etching.

However, the multiwavelength semiconductor laser array of the present invention is not limited to the above laser application of ridge waveguide structure, but also can be applied to other conventional waveguide structures such as gain-guided, weakly index-guided, and strongly index-guided structures. Those conventional waveguide structures are generally employed in the art, so the details will not be described herein again.

Figure 2:
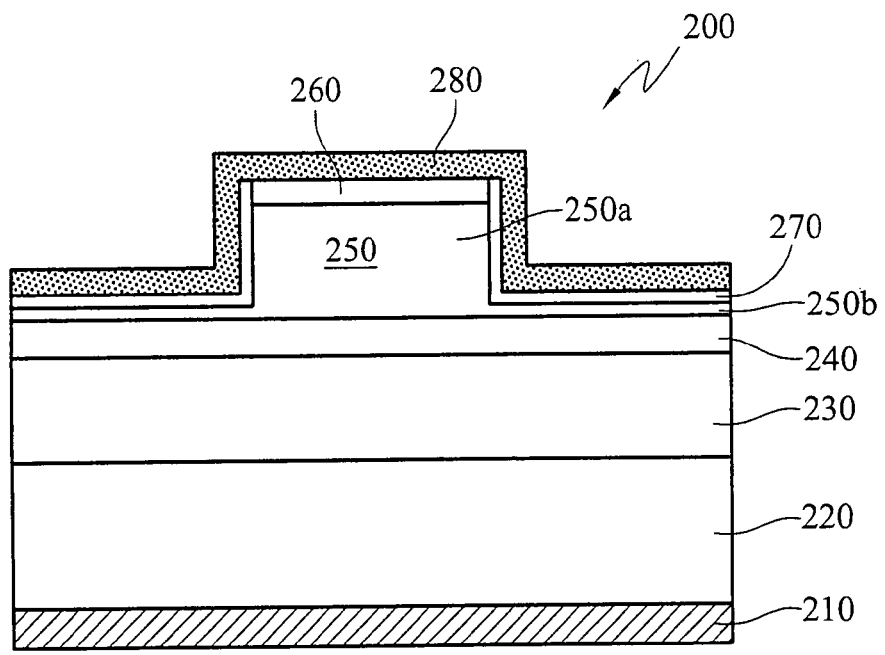
FIG. 2 is a sectional view of the multiwavelength semiconductor laser array according to the first embodiment of the present invention.

The configuration of a laser resonator is illustrated in detail below with reference to FIG. 2, and FIG. 2 is a sectional view of the multiwavelength semiconductor laser array of the present invention.

As shown in FIG. 2, a laser resonator 200 is a ridge protruding structure and has a corresponding resonant cavity. Once the current applied to the laser resonator 200 exceeds the critical current value, a single-wavelength band laser is generated through oscillation in the resonant cavity. The laser resonator 200 includes a lower electrode layer 210, a substrate 220, a lower cladding layer 230, an active region 240, an upper cladding layer 250, a contact layer 260, an insulation layer 270, and an upper electrode layer 280.

The substrate 220 is used for support and is made of a semiconductor material. Besides, the substrate 220 is usually doped with n-type or p-type conductive ions at a predetermined concentration, so as to reduce the resistance and to facilitate the conduction of the charges. For example, the substrate 220 is an n-type GaAs substrate.

The lower electrode layer 210 is formed on the bottom surface of the substrate 220, for injecting electrons required for generating a laser. The lower electrode layer 210 is usually made of metal materials, for example, Ni, Au, or a multi-layer metal film formed by AuGe/Ni/Au.

An epitaxial layer formed by the lower cladding layer 230, the active region 240, the upper cladding layer 250, and the contact layer 260 is sequentially formed on the surface of the substrate 220. The epitaxial layer structure can be formed by means of molecular beam epitaxy (MBE) or metalorganic chemical vapor deposition (MOCVD). The active region 240 is sandwiched between the lower cladding layer 230 and the upper cladding layer 250 to form a double heterostructure. Furthermore, the lower cladding layer 230 and the upper cladding layer 250 have different conductive modes, in which one is of an n-type conductive mode, and the other is of a p-type conductive mode. The lower cladding layer 230 and the upper cladding layer 250 are both made of materials with a relatively large energy gap, and they are used for confining injected electrons and holes to make the electrons and holes be effectively injected into the active region 240. For example, the lower cladding layer 230 is made of n-type AlGaAs material, and the upper cladding layer 250 is made of p-type AlGaAs material. In addition, the upper cladding layer 250 is of a ridge stripe structure, and formed by a ridge portion 250a and a flat portion 250b disposed below the ridge portion 250a. The upper cladding layer 250 is used to confine the light beams generated by the active region 240 in the horizontal direction of the active region 240, thereby maintaining the stability of the lateral (horizontal) optical mode.

The contact layer 260 disposed on the upper cladding layer 250 is used to reduce the contact resistance between the upper electrode layer 280 and the upper cladding layer 250, thus achieving a preferred ohmic contact. The material of the contact layer 260 is generally doped with conductive ions at a predetermined concentration. For example, the contact layer 260 is p-type GaAs material, p-type InGaAs material; or p-type GaN material.

The insulation layer 270 is formed at both sides of the ridge portion 250a and on the upper surface of the flat portion 250b, for defining an electrode contact region, such that the current injected into the active region 240 is concentrated to enhance the charge density per each unit of volume, and thereby providing an effective index waveguide effect. Generally, the insulation layer 270 can be made of a common dielectric material, for example, $Si_3N_4$ or $SiO_2$.

The upper electrode layer 280 is formed on the contact layer 260 and the insulation layer 270, for injecting holes required for generating a laser, and it is usually made of metal materials, for example, Au, Ti, or a multi-layer metal film formed by Ti/Pt/Au.

The electrons injected from the lower cladding layer 230 and the holes injected from the upper cladding layer 250 are recombined in the active region 240, so as to emit lights.

Figure 3:
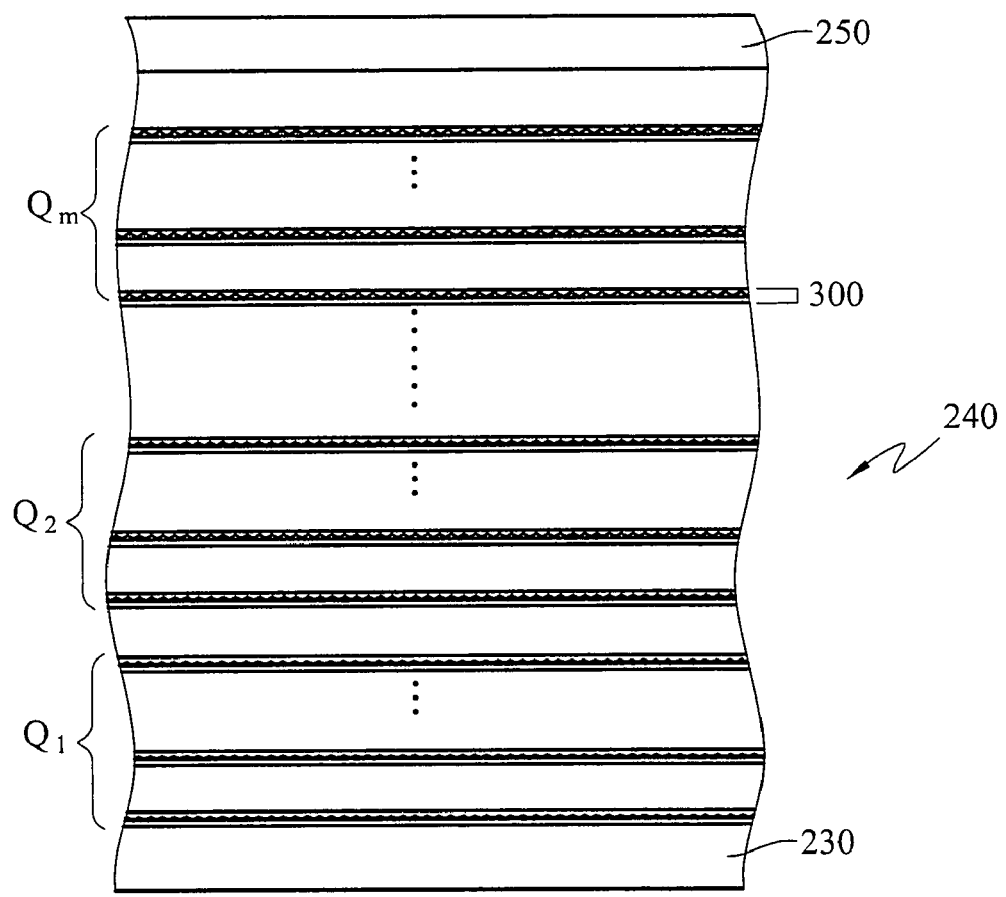
FIG. 3 is a schematic structural view of the active region of the multiwavelength semiconductor laser array according to the present invention.

Referring to FIG. 3, it is a schematic structural view of the active region. The active region 240 is formed by stacking m wave band regions $Q_1$ to $Q_m$ and the wavelength of the laser generated by each of the wave band regions $Q_1$ to $Q_m$ varies from each other. In addition, the wave band regions are stacked sequentially from the lower cladding layer 230 to the upper cladding layer 250 as the wavelength decreases.

Figure 4:
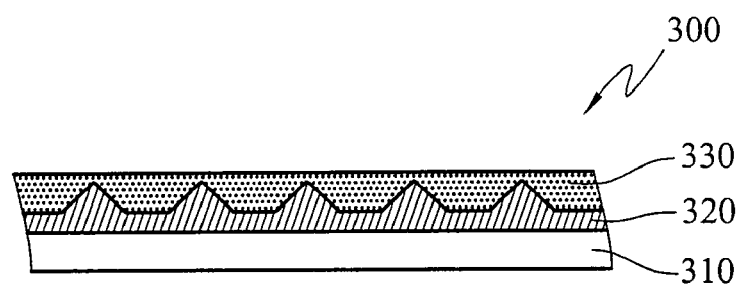
FIG. 4 is a schematic view of the periodic structure unit of the active region in FIG. 3.

Furthermore, as shown in FIG. 4, each of the wave band regions $Q_1$ to $Q_m$ includes a plurality of periodic structure units 300 formed by means of epitaxy. Each of the periodic structure units 300 includes a spacer layer 310, a quantum dot layer 320, and a quantum dot capping layer 330, which are sequentially deposited. The quantum dot layer 320 is a thin film having many quantum dot structures, and the electrons and the holes are recombined into photons in the quantum dot structures. Furthermore, in the quantum dot structure, due to the mismatch of lattice constant between different materials of the quantum dot layer 320 and the spacer layer 310 therebelow, strain accumulation occurs, and then, zero-dimensional self-assembled quantum dots are formed due to strain relaxation, that is so-called Stranski-Kranstanov growth mode (S-K growth mode). The materials suitable for the quantum dot layer 320 include semiconductor materials, such as InAs, $In_xGa_{1-x}As$, $In_xGa_{1-x}AsN$, $In_xGa_{1-x}AsSb$, $In_xGa_{1-x}AsNSb$, $In_xN$, $In_xGa_{1-x}N$, and $In_xGa_zAl_{1-x-y}N$, in which $0<x<1$, $0<z<1$. The materials suitable for the quantum dot capping layer 330 include semiconductor materials, such as $In_yGa_{1-y}As$, $In_yGa_{1-y}N$, and $In_yGa_zAl_{1-y-z}N$, in which $0<y<1$, $0<z<1$. Moreover, the content of In in the material of the quantum dot layer 320 is higher than that in the quantum dot capping layer 330, i.e., $x>y$. The possible emission wavelength can be modulated by changing the thickness and the material composition of the quantum dot layer 320 and the quantum dot capping layer 330. Furthermore, the spacer layer 310 is formed to confine the injected carriers, so as to reduce the possibility for carriers to escape from the quantum dot layer 320, and it is generally made of binary compound semiconductor materials, for example, GaAs or GaN.

If a forward bias current is applied to the upper electrode layer 280 and the lower electrode layer 210, the holes and the electrons are respectively injected into the active region 240 from the upper cladding layer 250 and the lower cladding layer 230. Both the upper cladding layer 250 and the lower cladding layer 230 can prevent the holes and the electrons from escaping out of the active region 240. At this time, the holes and the electrons are recombined in the active region 240, and then released in the form of photons. If the bias current is continuously increased to the critical current value, i.e., the applied current is high enough to reach the population inversion condition, the induced release of the photons begins, and meanwhile, oscillation between the reflection mirrors at both ends of the laser resonators $A_1$ to $A_n$ is carried out and amplified to generate a laser. If the gain ($g_{th}$) caused by the bias current applied to each of the laser resonators $A_1$ to $A_n$ is sufficient for compensating the internal loss ($\alpha_i$) as light passes through the laser resonators $A_1$ to $A_n$ and the mirror loss ($\alpha_m$) as light leaves the laser resonators $A_1$ to $A_n$ after being reflected by the mirrors, the resonance conditions are satisfied to generate a laser. That is, the optical modal gain ($g_{th}$) must satisfy the following formula:

$$g_{th} = \alpha_i + \alpha_m = \alpha_i + \frac{1}{2L}\ln\left(\frac{1}{R_1 R_2}\right), \quad \text{(Formula 1)}$$

in which L indicates the cavity length, and $R_1$, $R_2$ indicate reflectances of the front end mirror and the rear end mirror respectively. Therefore, the laser resonators $A_1$ to $A_n$ with different cavity lengths will generate lasers in specific wave band regions corresponding to $Q_1$ to $Q_m$, so as to achieve a multiwavelength laser array applicable for the optical fiber communication technology or an optical disc drive pickup head.

Figure 5:
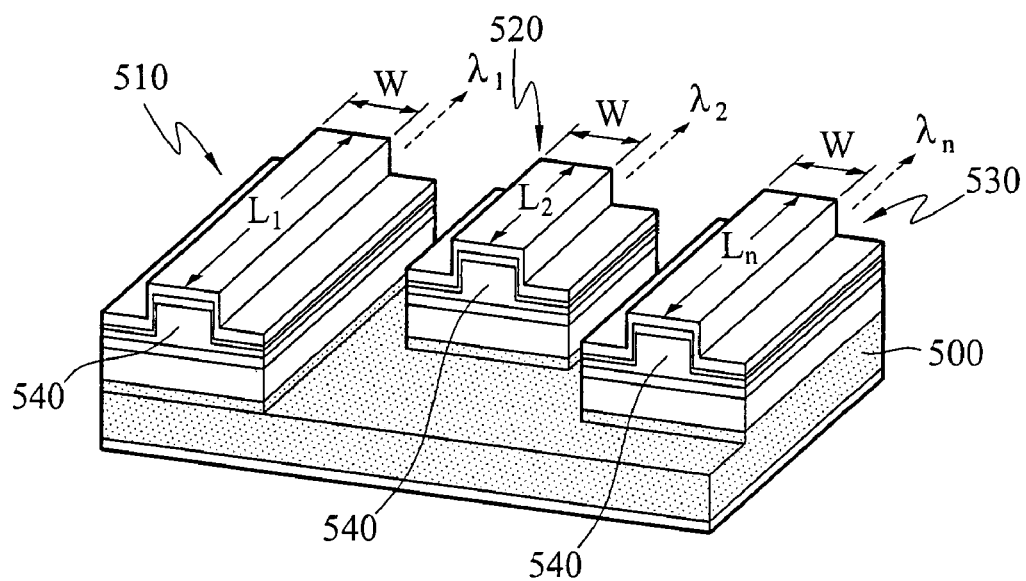
FIG. 5 is a stereogram of the multiwavelength semiconductor laser array with three different cavity lengths according to the first embodiment of the present invention.
Figure 6:
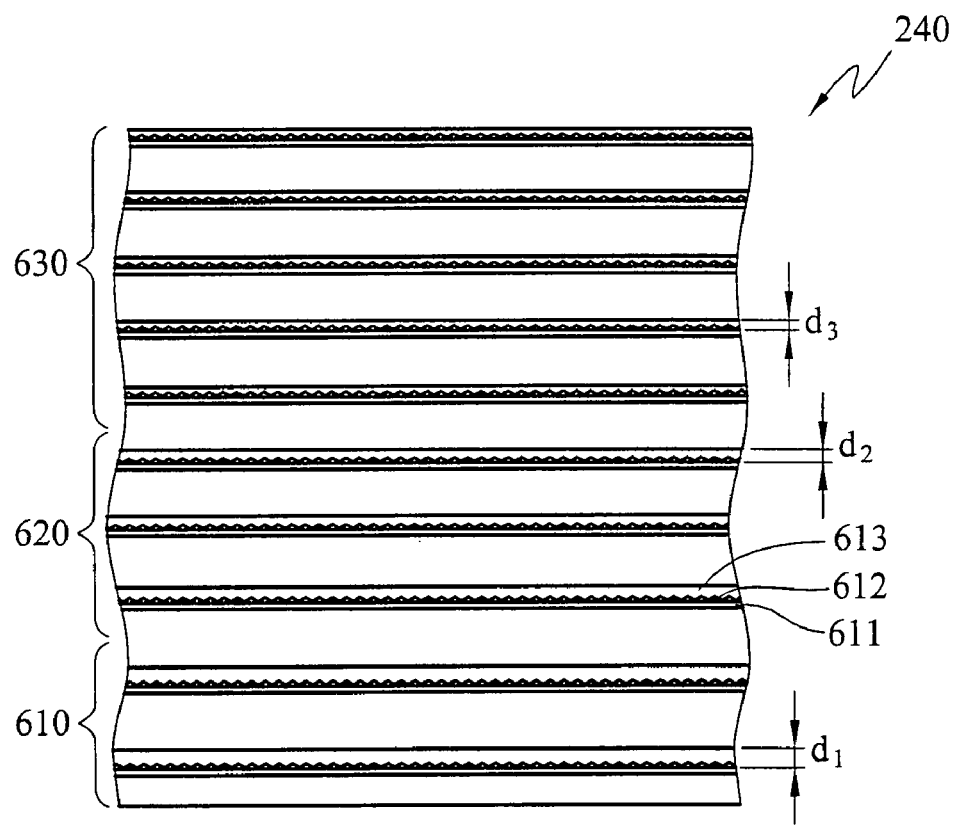
FIG. 6 is a structural diagram of the active region of the multiwavelength semiconductor laser array according to the first embodiment of the present invention.

Referring to FIG. 5 and FIG. 6, FIG. 5 is a stereogram of the multiwavelength semiconductor laser array with three different cavity lengths according to the first embodiment of the present invention, and FIG. 6 is a structural diagram of the active region according to the first embodiment of the present invention. Referring to FIG. 5, laser resonators 510, 520, and 530 formed on an n-type GaAs substrate 500 all have a ridge waveguide structure 540 with a width W of 5 µm, and their cavity lengths $L_1$ to $L_3$ are respectively 5 mm, 1.5 mm, and 0.4 mm. Furthermore, referring to FIG. 6, each of the laser resonators 510, 520, and 530 has an active region 240 formed by stacking three wave band regions with different emission wavelengths, which are respectively a longer wave band region 610, a medium wave band region 620, and a shorter wave band region 630, stacked sequentially from the bottom up. Herein, the longer, medium, and shorter wavelengths are defined by means of comparing the wave band regions. Each of the wave band regions 610, 620, and 630 includes many periodic structure units, and each of the periodic structure units is formed by stacking a GaAs spacer layer 611, an InAs quantum dot layer 612, and an $In_{0.15}Ga_{0.85}As$ quantum dot capping layer 613. However, the thickness of the $In_{0.15}Ga_{0.85}As$ quantum dot capping layer 613 in each of the wave band regions 610, 620, and 630 is respectively $d_1$, $d_2$, and $d_3$ ($d_1>d_2>d_3$). As such, different strain effects may be generated between the InAs quantum dot layer 612 and the $In_{0.15}Ga_{0.85}As$ quantum dot capping layer 613 due to different thicknesses, and thus influencing the variation of the lattice arrangement, so as to modulate the three wave band regions 610, 620, and 630 to generate lasers at different wavelengths. The longer wave band region 610 is formed by two groups of periodic layered structures; the medium wave band region 620 is formed by three groups of periodic layered structures; and the shorter wave band region 630 is formed by five groups of periodic layered structures.

Figure 7:
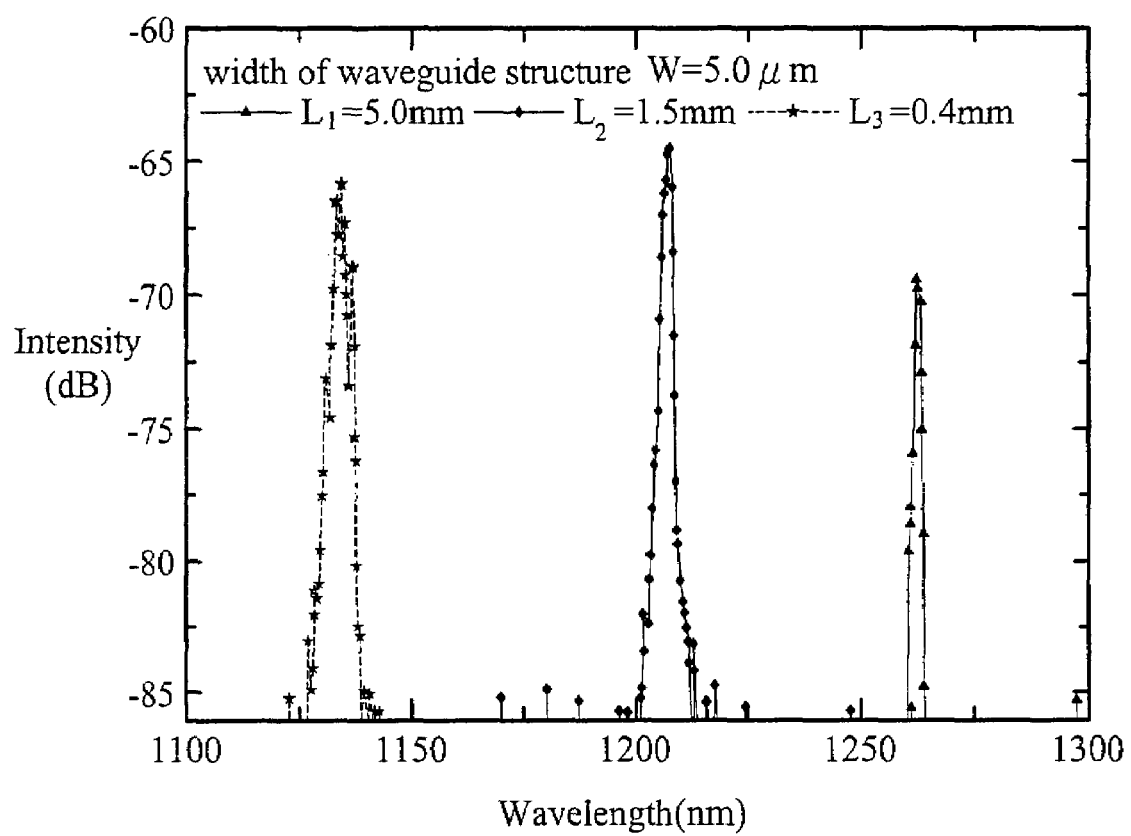
FIG. 7 shows the lasing spectra for three different cavity lengths with the active region of FIG. 6 according to the first embodiment of the present invention.

Afterwards, the above structure is cut into semiconductor lasers with various cavity lengths for performing a light emission spectrum test, and the test results can be obtained with reference to a relation graph of the emission intensity to the wavelength in FIG. 7. If the cavity length is longer, according to Formula 1, the mirror loss ($\alpha_m$) generated as light leaves the laser resonators after being reflected by the mirrors decreases. At this time, the optical modal gain ($g_{th}$) generated by the longer wave band region 610 with a small number of stacking is sufficient for compensating the total energy loss ($\alpha_i+\alpha_m$), so as to make the longer wave band region 610 generate a laser. On the contrary, if the cavity length is shorter, the mirror loss ($\alpha_m$) generated as light leaves the laser resonators after being reflected by the mirrors increases, such that the optical modal gain ($g_{th}$) generated by the longer wave band region 610 is not sufficient for compensating the total energy loss ($\alpha_i+\alpha_m$), and thus the longer wave band region 610 cannot generate a laser. As the medium wave band region 620 or the shorter wave band region 630 with a large number of stacking has a high charge carrier density, the total energy loss ($\alpha_i+\alpha_m$) is compensated, and thus, the medium wave band region 620 or the shorter wave band region 630 generates a laser. Therefore, as shown in the laser spectrum of FIG. 7, the laser resonator 510 with the cavity length $L_1$ of 5 mm generates a laser from the longer wave band region 610, and its wavelength is 1262 mm. The laser resonator 520 with the cavity length $L_2$ of 1.5 mm generates a laser from the medium wave band region 620, and its wavelength is 1206 mm. The laser resonator 530 with the cavity length $L_3$ of 0.4 mm generates a laser from the shorter wave band region 630, and its wavelength is 1133 mm.

Figure 8:
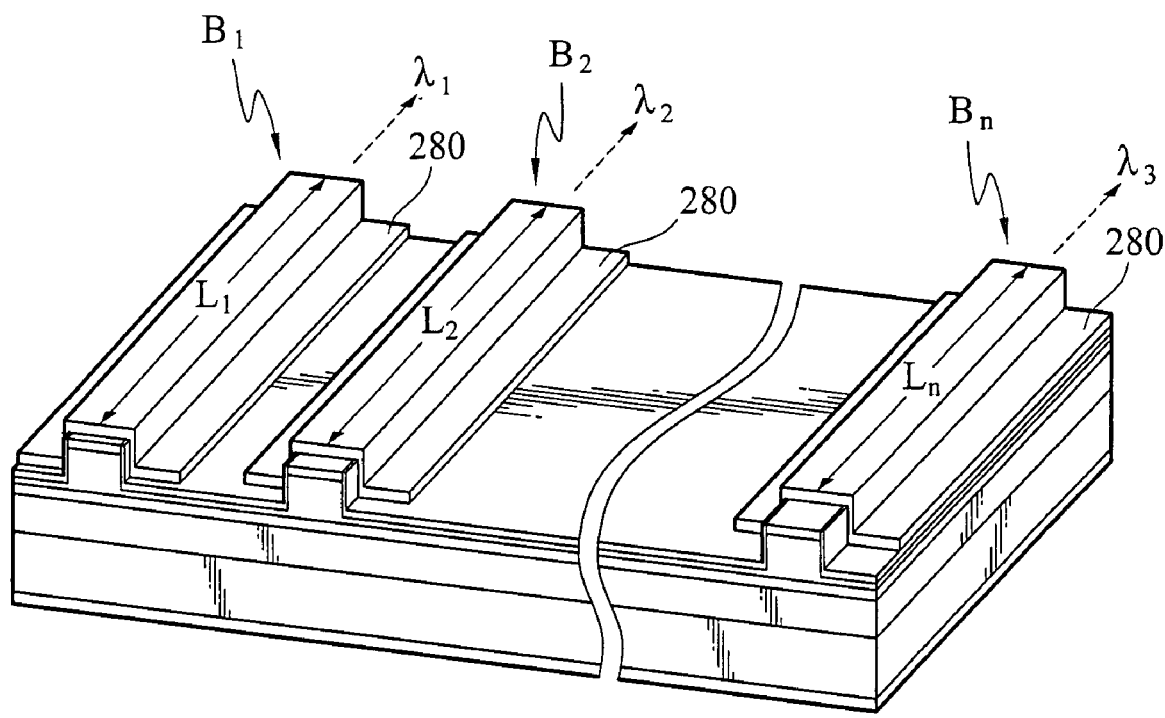
FIG. 8 is a structural stereogram of a multiwavelength semiconductor laser array according to a second embodiment of the present invention.

Next, referring to FIG. 8, it is a structural stereogram of a multiwavelength semiconductor laser array according to a second embodiment of the present invention. The main structure of the multiwavelength semiconductor laser array of this embodiment is similar to that of the first embodiment, and the major difference there-between lies in that, the laser resonators $B_1$ to $B_n$ have upper electrode layers 280 of different lengths. If the length of the upper electrode layer 280 is longer, more region with current pumping for higher optical gain and less region without current pumping for smaller optical loss. At this time, the optical modal gain ($g_{th}$) generated by the longer wave band region of a small number of stacking is sufficient for compensating the total energy loss ($\alpha_i+\alpha_m$), so as to make the longer wave band region generate a laser. On the contrary, if the length of the upper electrode layer 280 is shorter, less region with current pumping for smaller optical gain and more region without current pumping for higher optical loss, such that the optical modal gain ($g_{th}$) generated by the longer wave band region is not sufficient for compensating the total energy loss ($\alpha_i+\alpha_m$), and thus the longer wave band region cannot generate a laser. As the medium wave band region or the shorter wave band region with a large number of stacking has a high charge carrier density, the total energy loss ($\alpha_i+\alpha_m$) is compensated, and thus, the medium wave band region or the shorter wave band region generates a laser. Thus, each of the laser resonators $B_1$ to $B_n$ selects one from different wave band regions for generating a single-wavelength band laser depending upon the length of the upper electrode layer 280, and achieves the purpose of the multiwavelength laser array of the present invention, together with the lasers of various wavelengths $\lambda_1$ to $\lambda_m$ generated by the laser resonators $B_1$ to $B_n$, so as to be applicable for the optical fiber communication technology or the optical disc drive pickup head.

(Method of Fabricating Multiwavelength Semiconductor Laser Array)

The method of fabricating the multiwavelength semiconductor laser array of the first embodiment is illustrated below in this embodiment with reference to the drawings. Referring to FIGS. 9 to 13, they are sectional views of the process of fabricating the multiwavelength semiconductor laser array according to the first embodiment of the present invention respectively.

Figure 9:
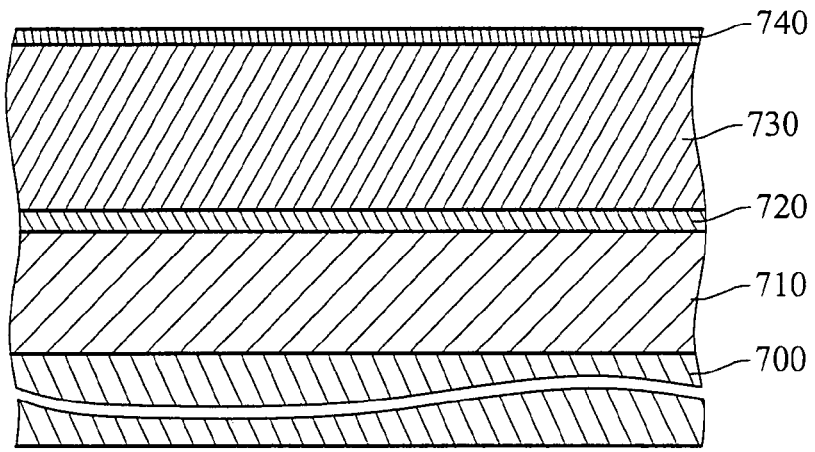
FIGS. 9 to 13 are sectional views of the steps for a method of fabricating the multiwavelength semiconductor laser array according to the first embodiment of the present invention.
Figure 10A:
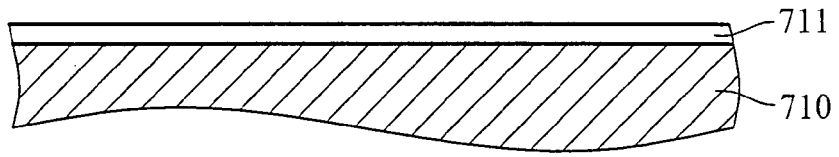
Figure 10B:
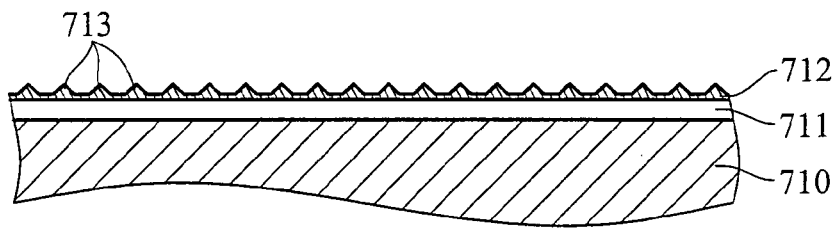
Figure 10C:
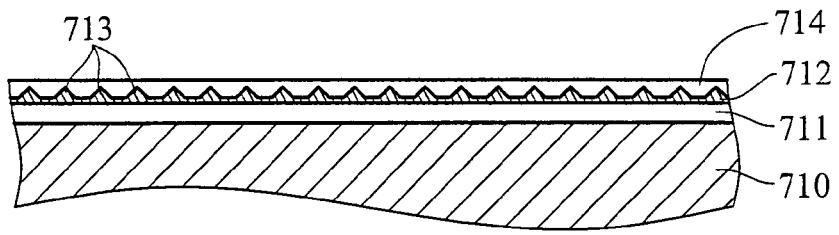

First, referring to FIG. 9, a lower cladding layer 710, an active region 720, an upper cladding layer 730, and a contact layer 740 are sequentially deposited on a substrate 700 by means of MBE or MOCVD. As shown in FIGS. 10A to 10C, the active region 720 is formed by a series of repeated stacking processes. In FIG. 10A, a spacer layer 711 is first formed on the lower cladding layer 710. Next, in FIG. 10B, a quantum dot layer 712 is formed on the spacer layer 711, and has a plurality of quantum dots 713 formed thereon. Then, in FIG. 10C, a quantum dot capping layer 714 is further formed in sequence. The spacer layer 711, the quantum dot layer 712, and the quantum dot capping layer 714 are sequentially deposited to form a periodic structure unit, which is deposited repeatedly till reaching a predetermined layer number or thickness. In this way, the wave band regions $Q_1$-$Q_m$ of different light emission conditions as shown in FIG. 3 can be achieved. The substrate 700 is an n-type GaAs substrate. The lower cladding layer 710 is made of n-type AlGaAs material. The active region 720 is formed by stacking m wave band regions with periodic structure units, and each of the periodic structure units is formed by sequentially depositing a GaAs spacer layer, an InAs quantum dot layer, and an $In_{0.15}Ga_{0.85}As$ quantum dot capping layer. The upper cladding layer 730 is made of a p-type AlGaAs material, and the contact layer 740 is made of a p-type GaAs material.

Figure 11:
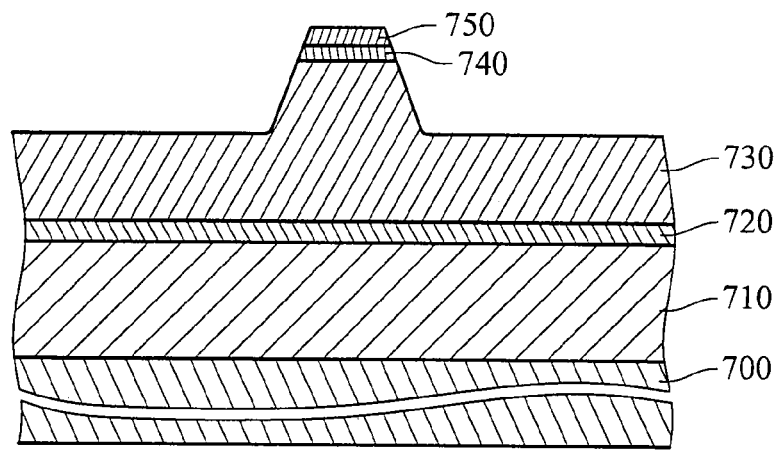

Afterwards, as shown in FIG. 11, a layer of photoresist material is deposited on the contact layer 740, and then, it is patterned by lithography to form an etching mask 750. The portions that are not masked by the etching mask 750, i.e., the upper portions of the contact layer 740 and the upper cladding layer 730 are etched into N ridge structures with a width W and parallel to each other by means of wet or dry etching. The ridge structure is formed by a ridge portion formed on the etched upper portion of the upper cladding layer 730, and a flat portion formed on the un-etched lower portion of the upper cladding layer 730.

Figure 12:
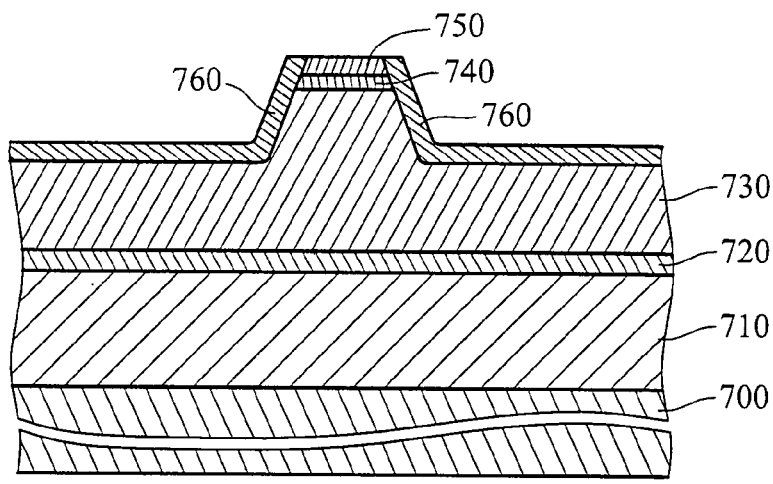

Then, as shown in FIG. 12, using the etching mask 750 as a barrier for selective growth, $SiO_2$ is deposited on the side surface of the ridge portion and the upper surface of the flat portion through CVD, so as to form an insulation layer 760.

Figure 13:
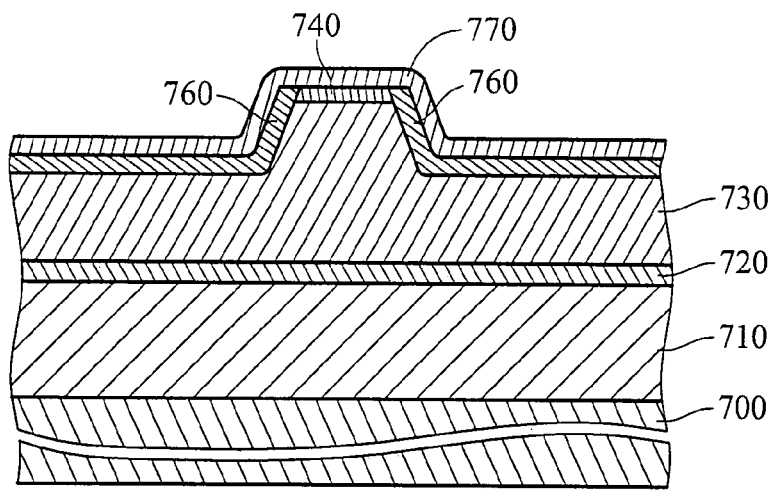

As shown in FIG. 13, after the etching mask 750 on the contact layer 740 is removed, a layer of multi-layer metal film formed by Ti/Pt/Au is deposited on the insulation layer 760 and the contact layer 740, thus constituting an upper electrode layer 770 that forms an ohmic contact with the contact layer 740.

Next, the laser resonators $A_1$ to $A_n$ with different cavity lengths $L_1$ to $L_n$ as shown in FIG. 1 are defined by means of lithography and etching, and meanwhile, the rear end mirrors of the laser resonators $A_1$ to $A_n$ are formed by etching.

Then, a multi-layer metal film formed by AuGe/Ni/Au is formed on the bottom surface of the substrate 700 by means of evaporation, so as to form a lower electrode layer (not shown).

Finally, the front end mirrors of the laser resonators $A_1$ to $A_n$ are formed through natural cleavage.

Thus, the multiwavelength laser array as shown in FIG. 1 is formed on the substrate 700 through the above process.

Figure 14:
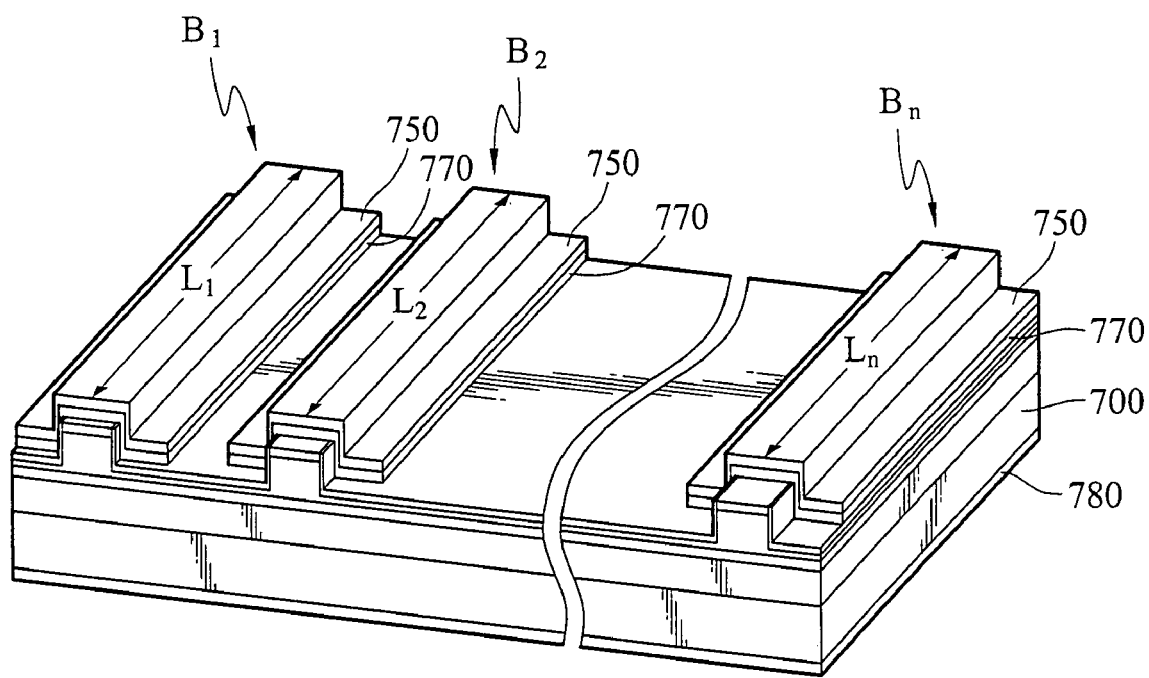
FIG. 14 is a sectional view of a method of fabricating the multiwavelength semiconductor laser array according to the second embodiment of the present invention.

Furthermore, the method of fabricating the multiwavelength semiconductor laser array can also be used to fabricate the multiwavelength semiconductor laser array of the second embodiment. As shown in FIG. 14, the major difference between the fabrication method of this embodiment and that of the first embodiment lies in that, before the deposition of upper electrode layer 770, different cavity lengths without metal coverage are selected masked by photolithography for subsequent metal lift-off. Afterwards, the multi-layer metal film formed by AuGe/Ni/Au is formed on the bottom surface of the substrate 700 by means of evaporation to serve as a lower electrode layer 780. Finally, the reflection mirrors at both ends of the laser resonators $B_1$ to $B_n$ are formed by means of natural cleavage or dry etching. Through the above process, a multiwavelength semiconductor laser array having upper electrode layer with different lengths is formed on the substrate 700 as shown in FIG. 8.

The present invention adopts a stacked quantum dot active region structure of various emission wavelengths together with a fabrication process to change the lengths of the laser resonators and the upper electrode layers to vary the threshold modal gain required for generating laser oscillation, such that each of the laser resonators generates a different single-wavelength band from a quantum dot active region capable of multiple wavelength emission depending on the carrier density. Thus, the complexity of the relevant process in the prior art is avoided, and the fabrication cost on epitaxial re-growth is also saved.

The invention being thus described, it will be obvious that the same may be varied in many ways. Such variations are not to be regarded as a departure from the spirit and scope of the invention, and all such modifications as would be obvious to one skilled in the arts are intended to be included within the scope of the following claims.

What is claimed is:

1. A multiwavelength semiconductor laser array, applicable for generating lasers of multiple wavelengths under a bias current, comprising:

a substrate; and a plurality of laser resonators, formed on the substrate and having a plurality of corresponding resonant cavities, wherein each of the laser resonators comprises an active region for generating a single-wavelength band laser, the active region is formed by alternately stacking a plurality of quantum dot layers and a plurality of quantum dot capping layers, and the laser resonators have at least two different cavity lengths;

wherein the active region comprises a plurality of spacer layers, the quantum dot layer is sandwiched between the spacer layer and the quantum dot capping layer to form a periodic structure unit; and wherein the active region further comprises a plurality of wave band regions for generating different emission wavelengths, and the wave band regions are formed by stacking a plurality of periodic structure units.

2. The multiwavelength semiconductor laser array as claimed in claim 1, wherein each of the quantum dot layers has a plurality of quantum dots.

3. The multiwavelength semiconductor laser array as claimed in claim 1, wherein each of the quantum dot layers is formed by a semiconductor material selected from a group consisting of InAs, $In_xGa_{1-x}As$, $In_xGa_{1-x}AsN$, $In_xGa_{1-x}AsSb$, $In_xGa_{1-x}AsNSb$, InN, $In_xGa_{1-x}N$, and $In_xGa_zAl_{1-x-z}N$, wherein $0<x<1$, $0<z<1$.

4. The multiwavelength semiconductor laser array as claimed in claim 1, wherein emission wavelength of the active region is modulated by changing thickness or material composition of each of the quantum dot layers.

5. The multiwavelength semiconductor laser array as claimed in claim 1, wherein each of the quantum dot capping layers is formed by a semiconductor material selected from a group consisting of $In_yGa_{1-y}As$, $In_yGa_{1-y}N$, and $In_yGa_zAl_{1-y-z}N$, wherein $0<y<1$, $0<z<1$.

6. The multiwavelength semiconductor laser array as claimed in claim 1, wherein emission wavelength of the active region is modulated by changing thickness or material composition of each of the quantum dot capping layers.

7. The multiwavelength semiconductor laser array as claimed in claim 1, wherein each of the spacer layers is made of GaAs or GaN.

8. The multiwavelength semiconductor laser array as claimed in claim 1, wherein the emission wavelengths of the wave band regions monotonically decrease as being far away from the substrate.

9. The multiwavelength semiconductor laser array as claimed in claim 1, wherein each of the laser resonators further comprises a first cladding layer and a second cladding layer; the active region is sandwiched between the first cladding layer and the second cladding layer; the first cladding layer is adjacent to a first electrode layer; and the second cladding layer is adjacent to a second electrode layer.

10. The multiwavelength semiconductor laser array as claimed in claim 1, wherein each of the laser resonators further comprises a gain-guided structure for guiding lights emitted from the active region.

11. The multiwavelength semiconductor laser array as claimed in claim 1, wherein each of the laser resonators further comprises a weakly index-guided structure for guiding lights emitted from the active region.

12. The multiwavelength semiconductor laser array as claimed in claim 1, wherein each of the laser resonators further comprises a strongly index-guided structure for guiding lights emitted from the active region.

13. The multiwavelength semiconductor laser array as claimed in claim 1, wherein the multiwavelength semiconductor laser array is applicable to optical fiber communication or an optical disc drive pickup head.

* * * * *